United States Patent
Oka et al.

(10) Patent No.: US 9,390,905 B2
(45) Date of Patent: Jul. 12, 2016

(54) METHOD FOR MANUFACTURING SILICON SUBSTRATE AND SILICON SUBSTRATE

(75) Inventors: Tetsuya Oka, Annaka (JP); Koji Ebara, Annaka (JP); Shuji Takahashi, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 89 days.

(21) Appl. No.: 13/982,584

(22) PCT Filed: Feb. 2, 2012

(86) PCT No.: PCT/JP2012/000696
§ 371 (c)(1),
(2), (4) Date: Jul. 30, 2013

(87) PCT Pub. No.: WO2012/114659
PCT Pub. Date: Aug. 30, 2012

(65) Prior Publication Data
US 2013/0316139 A1    Nov. 28, 2013

(30) Foreign Application Priority Data
Feb. 24, 2011   (JP) ................. 2011-037954

(51) Int. Cl.
*H01L 21/02* (2006.01)
*H01L 21/322* (2006.01)
*C30B 29/06* (2006.01)
*C30B 33/02* (2006.01)

(52) U.S. Cl.
CPC .......... *H01L 21/02027* (2013.01); *C30B 29/06* (2013.01); *C30B 33/02* (2013.01); *H01L 21/3225* (2013.01); *Y10T 428/24355* (2015.01)

(58) Field of Classification Search
CPC combination set(s) only.
See application file for complete search history.

(56) References Cited

U.S. PATENT DOCUMENTS

| | | | |
|---|---|---|---|
| 2003/0056715 | A1 | 3/2003 | Tachikawa et al. |
| 2003/0068890 | A1 | 4/2003 | Park |
| 2003/0104709 | A1 | 6/2003 | Kobayashi et al. |

(Continued)

FOREIGN PATENT DOCUMENTS

| | | |
|---|---|---|
| CN | 1405842 A | 3/2003 |
| CN | 101638807 A | 2/2010 |

(Continued)

OTHER PUBLICATIONS

Jan. 12, 2015 Search Report issued in Taiwanese Application No. 101103790.

(Continued)

*Primary Examiner* — Duy Deo
*Assistant Examiner* — Erin Bergner
(74) *Attorney, Agent, or Firm* — Oliff PLC

(57) ABSTRACT

A method for manufacturing a silicon substrate, including: performing a rapid heat treatment to a silicon substrate with a rapid-heating and rapid-cooling apparatus by maintaining the silicon substrate at a temperature that is higher than 1300° C. and not greater than a silicon melting point for 1 to 60 seconds, the silicon substrate being sliced from a silicon single crystal ingot grown by the Czochralski method; performing a first temperature decrease process down to a temperature in the range of 600 to 800° C. at a temperature decrease rate of 5 to 150° C./sec; and performing a second temperature decrease process in such a manner that a cooling time of X seconds and a temperature decrease rate of Y° C./sec meet $Y \leq 0.15X - 4.5$ when $X < 100$ and meet $Y \leq 10$ when $X \geq 100$.

4 Claims, 3 Drawing Sheets

LIFETIME EVALUATION
◉  1000 μsec OR MORE
○  500 μsec OR MORE AND LESS THAN 1000 μsec
△  100 μsec OR MORE AND LESS THAN 700 μsec
×  LESS THAN 100 μsec

(56) References Cited

U.S. PATENT DOCUMENTS

| | | | |
|---|---|---|---|
| 2009/0000535 A1* | 1/2009 | Ebara | C30B 15/04 117/3 |
| 2010/0038757 A1 | 2/2010 | Isogai et al. | |
| 2010/0055884 A1* | 3/2010 | Isogai | C30B 15/00 438/502 |
| 2011/0001219 A1 | 1/2011 | Ebara et al. | |
| 2012/0001301 A1 | 1/2012 | Ebara et al. | |
| 2013/0093060 A1 | 4/2013 | Oka et al. | |
| 2014/0051235 A1 | 2/2014 | Izumi et al. | |

FOREIGN PATENT DOCUMENTS

| | | |
|---|---|---|
| JP | A-2000-058509 | 2/2000 |
| JP | 2000-195868 A | 7/2000 |
| JP | A-2000-216106 | 8/2000 |
| JP | A-2001-503009 | 3/2001 |
| JP | A-2001-203210 | 7/2001 |
| JP | A-2003-297839 | 10/2003 |
| JP | A-2009-249205 | 10/2009 |
| JP | A-2010-212333 | 9/2010 |
| WO | WO 98/45507 A1 | 10/1998 |
| WO | 2009/066566 A1 | 5/2009 |
| WO | WO 2010/119614 A1 | 10/2010 |
| WO | WO 2012/008087 A1 | 1/2012 |

OTHER PUBLICATIONS

International Search Report issued in Application No. PCT/JP2012/000696; Dated Mar. 6, 2012 (With Translation).

May 5, 2015 Search Report issued in Chinese Application No. 2012800100579.

* cited by examiner

LIFETIME EVALUATION
◎ 1000 μsec OR MORE
○ 500 μsec OR MORE AND LESS THAN 1000 μsec
△ 100 μsec OR MORE AND LESS THAN 700 μsec
× LESS THAN 100 μsec

METHOD FOR MANUFACTURING SILICON SUBSTRATE AND SILICON SUBSTRATE

TECHNICAL FIELD

The present invention relates to a method for manufacturing a silicon substrate in which a denuded zone (which will be referred to as a DZ layer hereinafter) having no grown-in oxide precipitate, no grown-in defect and no RIE defect (a defect that can be detected by RIE) is formed from a substrate surface to a given depth and to a silicon substrate manufactured by this method.

BACKGROUND ART

In recent years, with a shrinking device for high integration of a semiconductor circuit, a demand for quality of silicon single crystal fabricated by a Czochralski method (which will be referred to as a CZ method hereinafter) that serves as a substrate of this circuit has been increased.

At the time of growing the silicon single crystal by the CZ method, oxygen of approximately 10 to 20 ppma (JEIDA: a conversion factor provided by Japan Electronic Industry Development Association is used) is usually dissolved into a melt from a quartz crucible and taken into the silicon single crystal at a silicon melt interface.

Then, in a process of cooling the silicon single crystal, the oxygen that has been taken into becomes a supersaturation state and agglomerates when a crystal temperature is reduced to 700° C. or less, and oxide precipitates (which will be also referred to as grown-in oxide precipitates) are formed. However, the size of the oxide precipitates is very small; therefore TZDB (Time Zero Dielectric Breakdown) characteristics as one of oxide dielectric breakdown voltage characteristics or device characteristics are not decreased on a shipping stage.

A defect caused due to single-crystal growth that decreases the oxide dielectric breakdown voltage characteristics or the device characteristics is a complex defect produced when a vacancy type point defect which is called a vacancy (which may be also referred to as Va hereinafter) and an interstitial silicon point defect which is called Interstitial-Si (which may be also referred to as I hereinafter) taken into the silicon single crystal from a silicon melt become supersaturated during cooling the crystal and they are agglomerated together with oxygen, and it has been revealed that it is a grown-in defect such as FPD, LSTD, COP, or OSF.

Before describing these defects, generally known matters about a factor that determines the concentration of each of Va and I that are taken into the silicon single crystal will be first described.

FIG. 5 is a view showing a defect region of a silicon single crystal when V/G, which is a ratio of a pulling rate V (mm/min) to an average value G (° C./mm) of a crystalline temperature gradient in a pulling shaft direction in a temperature range from a silicon melting point to 1300° C., is changed by varying V at the time of growing single crystal.

In general, a temperature distribution in single crystal is dependent on a CZ in-furnace structure (which will be referred to as a hot zone (HZ) hereinafter), and this distribution hardly varies even though a pulling rate is changed. Therefore, in the case of a CZ furnace having the same configuration, V/G is associated with a change in pulling rate alone. That is, the pulling rate V and V/G approximately has a relationship of direct proportion. Accordingly, an ordinate in FIG. 5 represents a pulling rate V.

In a region where the pulling rate V is relatively high, grown-in defects such as FPD, LSTD, or COP which can be considered as voids formed by agglomerating point defects called vacancies are densely present in the substantially entire region in a crystal radial direction, and the region where these defects are present is called a V-rich region.

When a growth rate is reduced, OSF rings produced in a crystal peripheral portion are contracted toward the inside of the crystal, and they are eventually annihilated. When the growth rate is further lowered, a neutral (which will be referred to as N hereinafter) region where deficiency or excess of vacancies or interstitial silicon hardly occurs appears. Although biased Va or I is present in this N region, it has saturated concentration or lower concentration, and hence the grown-in defect by agglomeration are not produced. This N region is divided into an Nv region where Va is dominant and an Ni region where I is dominant.

In the Nv region, it has been found out that, when a thermal oxidation treatment is effected, many oxide precipitates (bulk micro defects which will be referred to as BMDs hereinafter) are generated, and oxygen precipitation hardly occurs in the Ni region. Further, in a region where the growth rate is low, I becomes supersaturated, defects L/D (Large Dislocation: an abbreviation of an interstitial dislocation loop, e.g., LSEPD or LEPD) which can be considered as a dislocation loop generated as a result of assembling I are present at low density, and this region is called an I-Rich region.

Therefore, for example, when the single crystal pulled while controlling a growth rate so that the N region can be formed in the entire region in the radial direction from the center of the crystal is sliced and polished, a silicon substrate having the N region with greatly reduced defects can be obtained.

Moreover, when the above-described BMD is generated on the silicon substrate surface which is a device active region, device characteristics such as junction leakage are adversely affected but, on the other hand, if the BMD is present in a bulk other than the device active region, the BMD functions as a gettering site where a metal impurity mixed during the device process is captured, which is effective.

In recent years, as a method for forming BMD in a substrate having an Ni region where the BMD is hardly produced, a method for perform RTP (Rapid Thermal Process) (a rapid-heating and rapid-cooling heat treatment) has been suggested. This RTP treatment is a heat treatment method for rapidly increasing a temperature of a silicon substrate beyond a room temperature at a temperature increasing rate of, e.g., 50° C./second, heating and maintaining a temperature of approximately 1200° C. for approximately tens seconds, and rapidly effecting cooling.

A mechanism that the BMDs are formed when an oxide precipitate heat treatment is performed after the RTP treatment is described in Patent Literature 1 or Patent Literature 2 in detail. The BMD formation mechanism will now be briefly explained.

First, in the RTP treatment, Va are injected from a silicon substrate surface while a high temperature of 1200° C. is maintained in, e.g., an $N_2$ atmosphere, and then redistribution and annihilation with I due to spread of Va occur during a reduction in temperature. As a result, a state that Va are ununiformly distributed in a bulk is realized. When the silicon substrate in such a state is subjected to a heat treatment at, e.g., 800° C., clustering of oxygen rapidly occurs in a region having high Va concentration, but clustering of oxygen does not occur in a region having low Va concentration. Then, when a heat treatment is performed at, e.g., 1000° C. for a given period of time, the clustered oxygen grows, and the BMDs are formed.

When the oxygen precipitation heat treatment is performed with respect to the silicon substrate after the RTP treatment in this manner, the BMDs having a distribution in a thickness direction of the silicon substrate are formed in accordance with a concentration profile of Va formed by the RTP treatment. Therefore, a desired Va concentration profile is formed on the silicon substrate by effecting the RTP treatment while controlling its conditions such as an atmosphere, a maximum temperature, a retention time, and others, and then the silicon substrate having a desired DZ width and a BMD profile in a thickness direction can be manufactured by performing the oxygen precipitation heat treatment with respect to the silicon substrate.

Further, Patent Literature 3 discloses that an oxide film is formed on a surface when the RTP treatment is effected in an oxygen gas atmosphere, I is injected from an oxide film interface, and hence BMD formation is suppressed. In this manner, the RTP treatment can both promote and suppress the BMD formation depending on conditions, e.g., an atmospheric gas, a maximum retention temperature, and others.

Such an RTP treatment is annealing in a very short time, outdiffusion of oxygen hardly occurs, and a reduction in oxygen concentration in a surface layer can be ignored.

Furthermore, it is known that, when an MOS transistor is fabricated in a device process and a reverse bias is applied to a gate electrode for its operation, a depletion layer spreads, but if BMDs are present in this depletion layer region, and presence of the BMDs in this depletion layer can cause junction leak. Therefore, grown-in defects as typified by COP, BMD, or grown-in oxide precipitates must not be present in a surface layer which is an operating region for many devices.

To annihilate defects concerning oxygen like COP, OSF nucleuses, or oxide precipitates, there is a method for lowering oxygen concentration to a solid solubility limit or less. For example, when a heat treatment is performed at 1100° C. or more and oxygen concentration in a surface layer is lowered to a solid solubility limit or less by utilizing outdiffusion of oxygen, the defects can be annihilated. However, since the oxygen concentration in the surface layer is considerably lowered due to outdiffusion of oxygen, there is a problem that mechanical strength of the surface layer is also lowered.

Additionally, to allow a semiconductor device to properly function, a minority carrier must have a sufficient lifetime. It is known that the lifetime of the minority carrier (which will be referred to as a lifetime hereinafter) is lowered by formation of a defect level due to metal impurities, oxygen precipitation, vacancies, and others. Therefore, to safely secure a function of a semiconductor device, a silicon substrate must be manufactured by a method that can realize a sufficient lifetime.

Therefore, in recent devices, a wafer with a sufficient lifetime in which grown-in defects or grown-in oxide precipitates concerning oxygen are not present in a device operating region and BMDs serving as gettering sites are sufficiently precipitated in a bulk outside the device operating region by a device heat treatment is effective.

Patent Literature 1 discloses a method for slicing out a silicon substrate having an entire plane of an N region from N-region single crystal in which agglomerates of Va or I are not present and performing an RTP treatment with respect to the silicon substrate. In case of this method, since grown-in defects are not present in Si which is a material, it can be considered that no problem occurs even though the RTP treatment is performed but, when TDDB (Time Dependent Dielectric Breakdown) characteristics as temporal breakdown voltage characteristics presenting long-term reliability of an oxide film are measured after preparing a silicon substrate having an entire plane of an N region and performing the RTP treatment, TZBD characteristics hardly lowered in an Nv region of the silicon substrate, but the TDDB characteristics may be lowered in some cases. Further, as disclosed in Patent Literature 4, since a region where the TDDB characteristics are lowered is an Nv region and also a region where defects detected by the RIB method (RIE defects) are present, development of a silicon substrate having no RIE defect present in a surface layer and a manufacturing method thereof is very important.

The RIE method will now be described.

As the RIE method, there has been known a method disclosed in Patent Literature 5 as a method for evaluating small crystal defects containing silicon oxide (which will be referred to as SiOx hereinafter) in a silicon substrate while providing a resolution in a depth direction. According to this method, highly selective anisotropic etching such as reactive ion etching (which will be referred to as RIE hereinafter) is performed with respect to a main surface of the substrate until a fixed thickness is provided, and a remaining etching residue is detected, thereby evaluating crystal defects. Since an etching rate differs depending on a crystal defect forming region containing SiOx and a non-forming region (the etching rate is low in case of the former one), when the etching is performed, a conical protrusion having a crystal defect containing SiOx at an apex remains on a main surface of the substrate. Since the crystal defect is emphasized in the form of a protrusion by the anisotropic etching, and hence a very small defect can be easily detected.

A method for evaluating a crystal defect disclosed in Patent Literature 5 will now be described.

An oxide precipitate is formed when oxygen dissolved in a silicon substrate in a supersaturated state is precipitated as SiOx by a heat treatment. Further, when anisotropic etching having a high selectivity ratio is performed with respect to BMDs included in the silicon substrate in a halogen-contained mixed gas (e.g., $HBr/Cl_2/He+O_2$) atmosphere with a commercial available RIE device, conical protrusions generated due to the BMDs are formed as etching residues (hillocks). Therefore, the crystal defects can be evaluated based on the hillocks. For example, counting the number of obtained hillocks enables obtaining density of the BMDs in the silicon substrate in the etched range.

CITATION LIST

Patent Literature

Patent Document 1: Japanese Unexamined Patent Application Publication (Kokai) No. 2001-203210
Patent Document 2: Japanese Unexamined Patent Application Publication (Translation of PCT Application) No. 2001-503009
Patent Document 3: Japanese Unexamined Patent Application Publication (Kokai) No. 2003-297839
Patent Document 4: Japanese Unexamined Patent Application Publication (Kokai) No. 2009-249205
Patent Document 5: Japanese Unexamined Patent Application Publication (Kokai) No. 2000-58509

SUMMARY OF INVENTION

Technical Problem

As a result of conducting various researches, the inventors of the present invention have discovered that performing the RTP treatment at a temperature higher than 1300° C. enables RIE defects in a substrate surface layer to be annihilated. However, it has been also found that a new problem that the lifetime of the substrate subjected to the RTP treatment at a temperature higher than 1300° C. is greatly decreased after the heat treatment. Although the cause of this problem are not clear, it can be considered that heavily-concentrated vacancies are excessively generated in the substrate when the heat treatment is performed at a temperature higher than 1300° C., and the vacancies are agglomerated during a cooling process, or the vacancies are coupled with any other element present in the substrate to thereby form a defect level.

A drop in lifetime can be a factor that reduces a yield ratio in a device process or destabilizes a device function. In particular, when the lifetime is less than 500 μsec, a device defect may highly possibly occur, which can lead to a problem.

In view of the above-described problem, it is an object of the present invention to provide a method for manufacturing a silicon substrate which has no RIE defect in a surface layer and has a sufficiently long lifetime and also provide the silicon substrate.

Solution to Problem

To achieve this aim, the present invention provides a method for manufacturing a silicon substrate, comprising: performing a rapid heat treatment to a silicon substrate with a rapid-heating and rapid-cooling apparatus by maintaining the silicon substrate at a temperature that is higher than 1300° C. and not greater than a silicon melting point for 1 to 60 seconds, the silicon substrate being sliced from a silicon single crystal ingot grown by the Czochralski method; then performing a first temperature decrease process down to a temperature in the range of 600 to 800° C. at a temperature decrease rate of 5 to 150° C./sec; and performing a second temperature decrease process in such a manner that a cooling time of X seconds and a temperature decrease rate of Y° C./sec meet $Y \leq 0.15X - 4.5$ when $X < 100$ and meet $Y \leq 10$ when $X \geq 100$.

As described above, when the substrate is subjected to the rapid heat treatment by maintaining it at a temperature that is higher than 1300° C. and not greater than the silicon melting point for 1 to 60 seconds, RIE defects and others in the substrate surface layer can be effectively annihilated, and vacancies can be efficiently injected into the substrate. Further, when the temperature is decreased and the cooling is performed as described above, formation of defects which may cause reduction in lifetime can be suppressed. Therefore, it is possible to manufacture a high-quality silicon substrate having a lifetime of 500 μsec or more in which BMDs are excellently formed in its bulk and defects are not present in its surface layer as a device fabrication region.

At this time, it is preferable to perform the rapid heat treatment in an atmosphere containing a nitride-film forming atmospheric gas, a rare gas, or a mixture of these gases.

When the rapid heat treatment is performed in such an atmosphere, vacancies can be injected to the extent that sufficient BMDs can be precipitated while avoiding occurrence of slip dislocation.

At this time, it is preferable to use, as the silicon substrate subjected to the rapid heat treatment, a silicon single crystal wafer sliced from a silicon single crystal ingot which is grown by the Czochralski method and has an entire plane of an OSF region, an N region, or a mixed region of the OSF region and the N region.

When such a silicon single crystal wafer is used as the silicon substrate which is to be subjected to the rapid heat treatment according to the present invention, defects even in the substrate can be annihilated, and the silicon substrate having no defect in the device fabrication region can be more assuredly manufactured.

Further, the present invention provides a silicon substrate manufactured by the method for manufacturing a silicon substrate, wherein defects detected by the RIE method are not present at a depth of at least 1 μm from a surface of the silicon substrate that is to serve as a device fabrication region, and a lifetime of the silicon substrate is not shorter than 500 μsec.

According to the manufacturing method of the present invention, the above-described silicon substrate can be manufactured, and it can be a high-quality silicon substrate that can improve a yield ratio of device fabrication.

Advantageous Effects of Invention

As described above, according to the present invention, it is possible to manufacture the high-quality silicon substrate having a lifetime of 500 μsec or more in which defects are not present in the surface layer serving as the device fabrication region.

DESCRIPTION OF EMBODIMENTS

Although the present invention will now be described in detail as an embodiment with reference to the drawings, the present invention is not restricted thereto.

In a manufacturing method according to the present invention, first a silicon single crystal ingot is grown by the Czochralski method, and a silicon substrate is sliced from the silicon single crystal ingot.

The diameter or the like of the silicon single crystal ingot to be grown is not restricted in particular, and may be a diameter of, e.g., 150 mm to 300 mm or larger, and the ingot can be grown to a desired size in accordance with application.

Here, a single-crystal pulling apparatus that can be used for the manufacturing method according to the present invention will be described.

Figure 1:
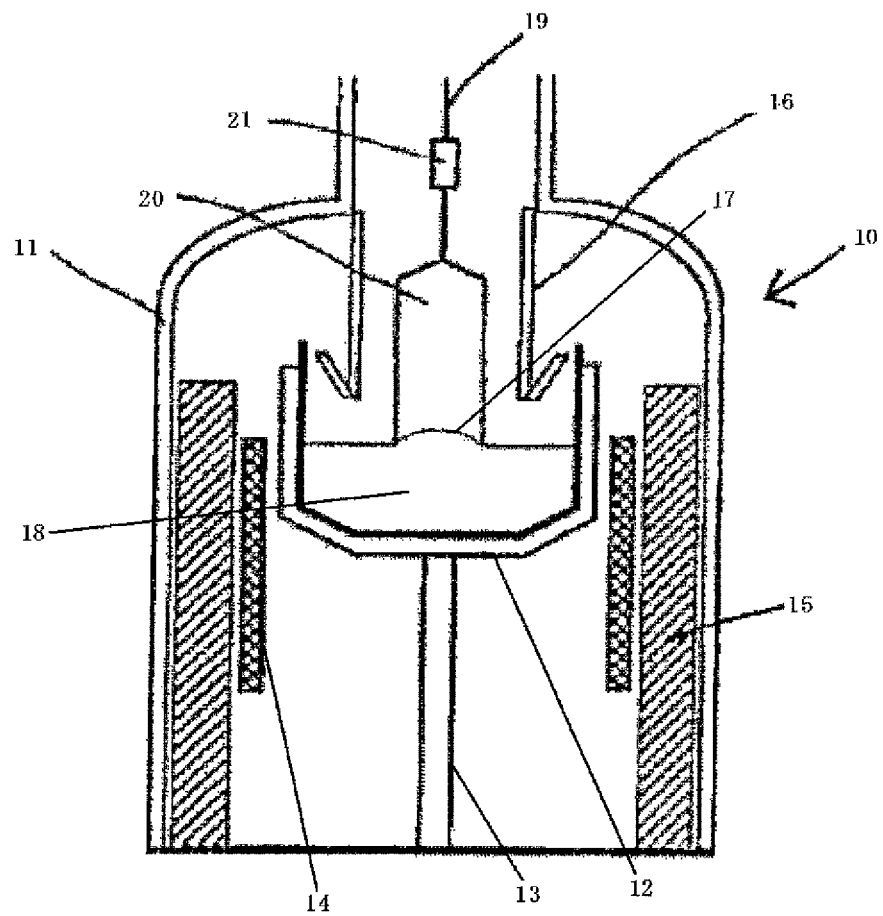
FIG. 1 is a schematic view showing an example of a single-crystal pulling apparatus.

FIG. 1 shows the single-crystal pulling apparatus 10. This single-crystal pulling apparatus 10 is constituted of a pull chamber 11, a crucible 12 in the pull chamber 11, a heater 14 arranged around the crucible 12, a crucible holding shaft 13 and its rotary mechanism (not shown) that are configured to rotate the crucible 12, a seed chuck 21 that holds a silicon seed crystal, a wire 19 that pulls the seed chuck 21, and a take-up mechanism (not shown) which rotates or takes up the wire 19. In regard to the crucible 12, a quartz crucible is provided, on the inner side thereof, on a side where a silicon melt 18 is accommodated, and a graphite crucible is provided on the outer side thereof. Additionally, an insulating material 15 is arranged on the outer periphery of the heater 14.

Further, in accordance with manufacturing conditions, an annular graphite cylinder (a gas flow-guide cylinder) 16 may be provided as shown in FIG. 1, or an annular outer insulating material (not shown) may be provided outside a solid-liquid interface 17 of the crystal. Furthermore, a cylindrical cooling apparatus which sprays a cooling gas or blocks radiant heat to cool the single crystal may be also provided.

Moreover, it is possible to use an apparatus using a so-called MCZ method, provided with a magnet (not shown) on the outer side of the pull chamber 11, to suppress a convection current of a silicon melt 18 and thereby grow the single crystal stably by applying a horizontal or vertical magnetic field to the melt.

In the present invention, as respective portions of these apparatuses, for example, the same portions as those in conventional examples can be used.

An example of a single-crystal growth method using the single-crystal pulling apparatus 10 will now be described.

First, a high-purity silicon polycrystalline raw material is heated to a melting point (approximately 1420° C.) or more and molten in the crucible 12. Then, the wire 19 is wound off so that the end of the seed crystal is brought into contact with or dipped into a substantially central part of the surface of the silicon melt 18. Then, the crucible holding shaft 13 is rotated in an appropriate direction, the wire 19 is rotated and taken up to pull the seed crystal, thereby starting growth of a silicon single crystal ingot 20.

Then, the pulling rate and the temperature are appropriately adjusted such that a desired defect region can be formed, and the substantially cylindrical silicon single crystal ingot 20 is obtained.

Figure 5:
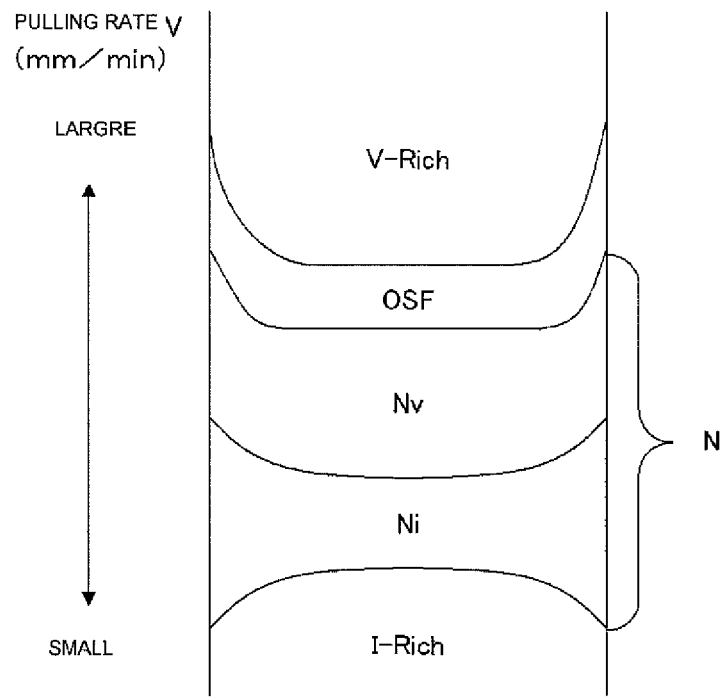
FIG. 5 is a view showing a relationship between a pulling rate and a defect region.

To efficiently control this desired pulling rate (a growth rate), for example, the ingot is grown while changing the pulling rate in advance, a preliminary test for checking a relationship between the pulling rate and the defect region is conducted to obtain, for example, such a relationship as shown in FIG. 5, and then the pulling rate is controlled in a main test based on this relationship, thus manufacturing the silicon single crystal ingot so as to obtain the desired defect region.

Furthermore, in regard to the defect region of the silicon single crystal ingot to be grown, although a silicon single crystal ingot having the entire plane of a V-rich region, an OSF region, an N region, or a mixture of these regions can be grown, the silicon single crystal ingot having the entire plane of the N region, the OSF region, or the mixture of the OSF region and the N region is preferably grown.

Since a silicon substrate having the above-described defect region rarely contains COPs that are hard to be annihilated the most, the defects can be assuredly annihilated by a rapid heat treatment according to the present invention, and RIE defects present at deeper positions can be easily annihilated, which is particularly effective.

Additionally, when the thus manufactured silicon single crystal ingot is, for example, sliced and polished, a silicon substrate can be obtained.

Further, it is known that vacancies in the silicon substrate are coupled with impurity elements contained in the silicon substrate, and it is considered that oxygen concentration in the silicon substrate greatly affects behaviors of the vacancies caused by the rapid heat treatment according to the present invention. Although a direct casual relationship between the vacancies and the lifetime is not clear, for example, in a silicon substrate having oxygen concentration of $5 \times 10^{17}$ atoms/cm$^3$ (JEIDA) or more before the rapid heat treatment, vacancy-oxygen pairs are produced at high concentration at the time of decreasing a temperature after the rapid heat treatment, and formation of defects that form a deep level that affects the lifetime can be readily suppressed, which is preferable. Such oxygen concentration can be adjusted during ingot growth described above.

Figure 2:
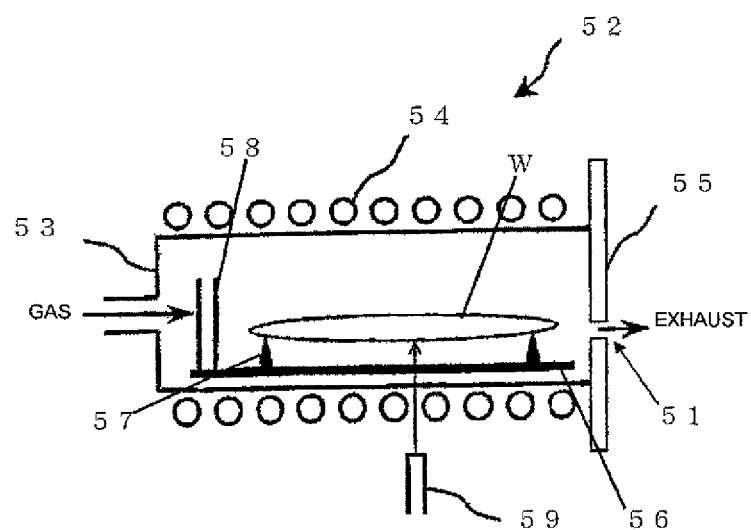
FIG. 2 is a schematic view showing an example of a rapid-heating and rapid-cooling apparatus of a single wafer processing type.

The thus fabricated silicon substrate is subjected to a rapid-heating and rapid-cooling treatment with e.g., a rapid-heating and rapid-cooling apparatus of a single-wafer-processing type. FIG. 2 shows a schematic view of an example of the rapid-heating and rapid-cooling apparatus of the single-wafer-processing type that can be used in the manufacturing method according to the present invention.

The rapid-heating and rapid-cooling apparatus 52 shown in FIG. 2 has a chamber 53 made of quartz, and a silicon substrate W can be subjected to a rapid heat treatment in this chamber 53. Heating is performed by heating lamps 54 (e.g., halogen lamps) arranged to surround the chamber from upper, lower, left, and right sides. The heating lamps 54 are configured to control independently supplied electric power.

On the gas exhaust side is provided an auto shutter 55 so that outside air is blocked. A non-illustrated wafer insertion opening configured to be opened/closed by a gate valve is provided in the auto shutter 55. Moreover, a gas exhaust opening 51 is provided in the auto shutter 55 so that an atmosphere in a furnace can be adjusted.

Additionally, the silicon substrate W is arranged on a three-point support portion 57 formed on a quartz tray 56. A quartz buffer 58 is provided on the gas introduction opening side of the quartz tray 56 so that an introducing gas such as an oxidized gas, a nitrided gas, or an Ar gas can be prevented from being directly applied to the silicon substrate W.

Further, a non-illustrated temperature measurement special window is provided in the chamber 53, and the temperature of the silicon substrate W can be measured through this special window with a pyrometer 59 installed outside the chamber 53.

Furthermore, in the manufacturing method according to the present invention, with the above-described rapid-heating and rapid-cooling apparatus, the rapid heat treatment is performed to the silicon substrate by maintaining the silicon substrate for 1 to 60 seconds at a temperature that is higher than 1300° C. and not greater than a silicon melting point, increased at a temperature increase rate of, e.g., 50° C./sec. Then, a first temperature decrease process is performed down to a temperature in the range of 600 to 800° C. at a temperature decrease rate of 5 to 150° C./sec, and a second temperature decrease process is subsequently performed so that a cooling time of X seconds and a temperature decrease rate Y° C./sec meet $Y \leq 0.15X - 4.5$ when $X < 100$ and meet $Y \leq 10$ when $X \geq 100$, for cooling.

When the silicon substrate is subjected to the rapid heat treatment at the temperature that is higher than 1300° C. and not greater than the silicon melting point in this manner, defects detected by the RIE method can be annihilated at a depth of at least 1 μm from a silicon substrate surface. The rapid heat treatment time falling within the range of 1 to 60 seconds is sufficient for annihilation of defects, but a time exceeding 60 seconds may possibly lead to a reduction in productivity, an increase in cost, occurrence of slip dislocation, and others. Moreover, the rapid heat treatment that is performed for 60 seconds or less can prevent oxygen concentration in a surface layer from being greatly reduced by excessive outdiffusion of oxygen during the rapid heat treatment, and it can also avoid a reduction in mechanical strength.

Additionally, the temperature decrease rate that is slower than 5° C./sec at the time of reducing the temperature that is higher than 1300° C. to a temperature in the range of 600 to 800° C. can lead to a decrease in productivity, and the temperature decrease rate faster than 150° C./sec may possible result in occurrence of slip due to rapid cooling.

When the temperature is lowered to a temperature in the range of 600 to 800° C. in the first temperature decrease process, a cooling time does not have to be excessively increased, and the vacancies can be sufficiently controlled at the time of the second temperature decrease process. When the second temperature decrease is started from a temperature higher than 800° C., a time required for cooing becomes long, and the productivity is degraded. When the second temperature decrease is started from a temperature lower than 600° C., the vacancies in the substrate cannot be sufficiently controlled.

Further, in the second temperature decrease process, when the cooling time of X seconds and the temperature decrease rate of $Y°$ C./sec are set so as to meet $Y \leq 0.15X-4.5$ when $X<100$ and meet $Y \leq 10$ when $X \geq 100$, the vacancies can be effectively controlled, and a reduction in lifetime can be suppressed. Such control is possible because it can be considered that diffusion of the vacancies produced at high concentration by the rapid heat treatment at the temperature higher than 1300° C. is promoted, the concentration is lowered, the vacancies are coupled with any other impurity element to form defects that do not shorten the lifetime, and formation of defects that shorten the lifetime caused due to vacancies can be thereby suppressed.

The above-described temperature decrease process according to the present invention can solve a new problem that the vacancies are excessively produced when the rapid heat treatment is performed at a temperature higher than 1300° C. to annihilate the RIE defects in the substrate surface layer, and the lifetime of the substrate is shortened by the defects produced due to the vacancies.

In the second temperature decrease process, the temperature can be decreased to e.g., a normal temperature or less. Moreover, since the second temperature decrease rate is relatively slow, the first temperature decrease rate from the temperature higher than 1300° C. to the temperature in the range of 600 to 800° C. is preferably set to a high rate in view of productivity and, in this case, the second temperature decrease process is performed at the temperature decrease rate lower than the first temperature decrease rate.

Although an atmosphere of the rapid heat treatment is not restricted in particular, it is preferable to perform the rapid heat treatment in an atmosphere containing a nitride-film forming atmospheric gas, a rare gas, or a mixture of these gases.

Using the above-described atmosphere enables suppressing slip dislocation as compared with a situation where the rapid heat treatment is performed in, e.g., a hydrogen atmosphere and a problem such as junction leakage due to the slip dislocation can be avoided, thus improving a device yield ratio. Moreover, the vacancies can be efficiently injected.

According to the above-described manufacturing method of the present invention, it is possible to manufacture the high-quality silicon substrate having a lifetime of 500 µsec or more in which defects detected by the RIE method are not present at a depth of at least 1 µm from the surface serving as the device fabrication region.

EXAMPLE

The present invention will now be more specifically described based on an example and comparative examples, but the present invention is not restricted thereto.

Example, Comparative Example 1

With the silicon single crystal pulling apparatus shown in FIG. 1, an N-region silicon single crystal ingot (a diameter: 12 inches (300 mm), an orientation: <100>, a conductivity type: p type) was grown while a transverse magnetic field was applied based on the MCZ method, and silicon single crystal wafers sliced from this ingot were each subjected to a heat treatment (a rapid heat treatment) at first temperatures of 1250° C., 1290° C., 1320° C., and 1350° C. for 10 seconds with the rapid-heating and rapid-cooling apparatus (Helios manufactured by Mattson in this example) shown in FIG. 2. In this rapid heat treatment, Ar, $N_2$, and $HN_3/Ar$ were used as the atmosphere.

Subsequently, the first temperature decrease process from the first temperature to a second temperature was performed at a temperature decrease rate of 30° C./sec. At this time, the second temperature was set to each of 900° C., 800° C., 700° C., 600° C., and 500° C. Then, in the second temperature decrease process from the second temperature, a predetermined temperature decrease rate and a cooling time were set, and the wafer was cooled. Then, a wafer surface was polished for approximately 5 µm.

Among the thus fabricated wafers, wafers obtained under conditions of an Ar atmosphere, a second temperature of 800° C., a temperature decrease rate of 9° C./sec, and a cooling time of 120 seconds in the second temperature decrease process were inspected in RIE defects in a wafer surface layer.

In this inspection, etching was performed with a magnetron RIE apparatus (Centura manufactured by Applied Materials). Then, residual protrusions after the etching were measured by a contamination inspection apparatus of a laser scattering type (SPI manufactured by KLA-Tencor), and defect density was calculated. Table 1 shows the results.

TABLE 1

| Atmosphere | First temperature | | | |
|---|---|---|---|---|
| | 1250° C. | 1290° C. | 1320° C. | 1350° C. |
| Ar | 116 | 65 | 0 | 0 |
| $N_2$ | 240 | 51 | 0 | 0 |
| $NH_3/Ar$ | 302 | 60 | 0 | 0 |

It can be understood from Table 1 that the RIE defects were completely annihilated in any atmosphere by the rapid heat treatment performed at a temperature higher than 1300° C. Further, since the results show the defects on the surface after polishing 5 µm, it can be understood that the defects present from the surface to the depth of at least 5 µm were annihilated by the rapid heat treatment at a temperature higher than 1300° C. in this example. On the other hand, when the temperature in the rapid heat treatment is each of 1290° C. and 1250° C., many RIE defects in the surface layer were seen, and it can be understood that each of these temperature was insufficient for annihilation.

Further, among the fabricated wafers, wafers were subjected to the heat treatment (the rapid heat treatment) at a first temperature of 1350° C. in the Ar atmosphere for 10 seconds, the first temperature decrease process was performed down to the second temperature of 800° C. at 30° C./sec, the second temperature decrease process was performed with various cooling times and temperature decrease rates, and the lifetime of the wafers was measured.

Figure 3:
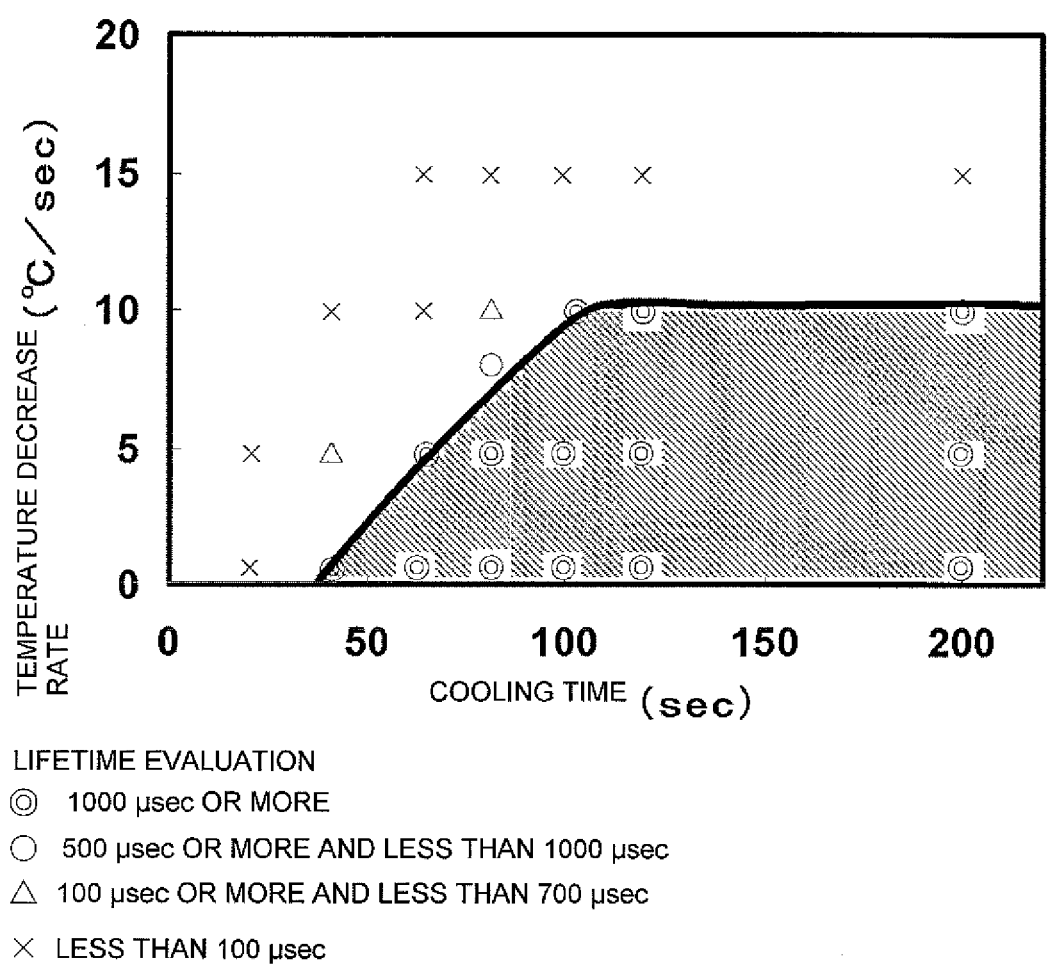
FIG. 3 is a graph showing a temperature decrease rate, a cooling time, and a lifetime evaluation result in each of Example and Comparative Example 1.

As the measurement method, a treatment for applying a solution obtained by dropping 2 g of iodine into ethanol to the wafer (a chemical passivation treatment, which will be referred to as a CP treatment hereinafter) was performed, and a lifetime was measured by a lifetime measurement apparatus (WT-2000 manufactured by SEMIILAB). FIG. 3 shows a relationship relative to the measured lifetime.

As shown in FIG. 3, it can be understood that, when the cooling time is shorter than 100 seconds, as the temperature decrease rate is smaller, the lifetime after the rapid heat treatment is more excellent. Furthermore, when the cooling time is 100 seconds or more, the excellent lifetime is obtained by setting the temperature decrease rate to 10° C./sec or less. Based on such a relationship, in the second temperature decrease process, assuming that the cooling time is X seconds and the temperature decrease rate is Y° C./sec, setting X and Y to meet the range represented by Y≤0.15X−4.5 when X<100 and Y≤10 when X≥100 (the range of a shaded area shown in the graph) enables manufacture of a wafer having a excellent lifetime.

Moreover, when the lifetime of the wafers in Example where the second temperature was set to each of 700° C. and 600° C. was measured, the same tendency as that in FIG. 3 appeared.

However, in Comparative Example where the second temperature was set to 900° C. or 500° C., the above-described relationship was not obtained, and the lifetime was reduced in the wafer subjected to the rapid heat treatment at a temperature higher than 1300° C. in this case.

Additionally, in each atmosphere of Ar, $N_2$, or $NH_3/Ar$, the heat treatment (the rapid heat treatment) was performed at each temperature of 1250° C., 1300° C., 1325° C., or 1350° C. for 10 seconds, the first temperature decrease process was performed down to a second temperature of 800° C. at a temperature decrease rate of 30° C./sec, then the second temperature decrease process was performed at a temperature decrease rate of 9° C./sec for a cooling time of 120 seconds, and BMD density of the wafer subjected to this treatment was measured.

Figure 4:
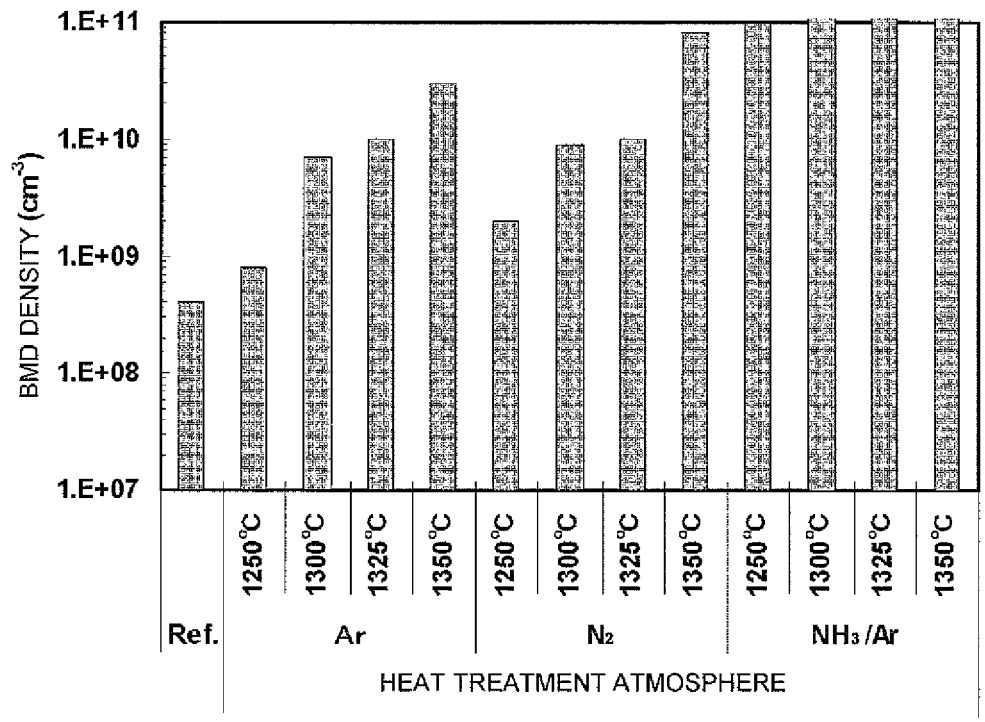
FIG. 4 is a graph showing a relationship between BMD density and a heat treatment temperature in each of Example and Comparative Example 1.

As the measurement method, a simulation heat treatment of a flash memory fabrication process was performed, and BMDs were precipitated in the wafer. The wafer was then immersed in 5% HF, and an oxide film formed on the surface was removed. Then, etching was performed with the RIE apparatus, the number of residual protrusions was measured by an electron microscope, defect density was calculated, and the BMD density was measured. FIG. 4 shows the measurement results. It is to be noted that, as a reference example (Ref. in FIG. 4), FIG. 4 also shows BMD density, which was measured in the same manner as above, in a wafer fabricated in the same manner as above except that the rapid-heating and rapid-cooling heat treatment was not performed.

As shown in FIG. 4, it can be understood that each atmosphere enables easily controlling formation of BMDs at the time of the device fabrication heat treatment. Furthermore, the BMD density is higher in each atmosphere as compared with a case where the rapid-heating and rapid-cooling heat treatment was not performed. Moreover, in any atmosphere, when the rapid heat treatment is performed at a temperature higher than 1300° C., the high BMD density is assured.

Comparative Example 2

With the silicon single crystal pulling apparatus shown in FIG. 1, an N-region silicon single crystal ingot (a diameter: 12 inches (300 mm), an orientation: <100>, a conductivity type: p type) was grown while a transverse field was applied based on the MCZ method, and silicon single crystal wafers sliced from this ingot were each subjected to a heat treatment (a rapid heat treatment) at first temperatures of 1250° C., 1290° C., 1320° C., and 1350° C. for 10 seconds with the rapid-heating and rapid-cooling apparatus (Helios manufactured by Mattson in this example) shown in FIG. 2. In this rapid heat treatment, Ar and $HN_3/Ar$ were used as the atmosphere.

Subsequently, the temperature was decreased from each heat treatment temperature to a normal temperature at a temperature decrease rate of 30° C./sec without performing the two-step temperature decrease. Then, the wafer surface was polished for approximately 5 μm.

RIE defects in a wafer surface layer of the thus fabricated wafer were measured like Example and Comparative Example 1. As a result, the same tendency as that in Table 1 was obtained. Additionally, Table 2 shows a result obtained by measuring a lifetime of the fabricated wafer like Example.

TABLE 2

| Atmosphere | 1250° C. | 1290° C. | 1320° C. | 1350° C. |
|---|---|---|---|---|
| Ar | ⊚ | ○ | X | X |
| $NH_3/Ar$ | ○ | Δ | X | X |

⊚ ... 1000 μsec or more
○ ... 500 μsec or more and less than 1000 μsec
Δ ... 100 μsec or more and less than 500 μsec
X ... less than 100 μsec As obvious from Table 2, it can be understood that, in any atmosphere, the lifetime is reduced as the temperature in the rapid heat treatment is increased, especially the lifetime is considerably reduced when the rapid heat treatment is performed at a temperature exceeding 1300° C., which becomes less than 100

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a silicon substrate, comprising:
    performing a rapid heat treatment to a silicon substrate with a rapid-heating and rapid-cooling apparatus by maintaining the silicon substrate at a first temperature that is higher than 1300° C. and not greater than a silicon melting point for 1 to 60 seconds, the silicon substrate being sliced from a silicon single crystal ingot grown by the Czochralski method;
    performing a first temperature decrease process down to a second temperature in the range of 600 to 800° C. at a temperature decrease rate of 5 to 150° C./sec;
    and performing a second temperature decrease process from the second temperature in such a manner that a cooling time of X seconds and a temperature decrease rate of Y° C./sec meet Y≤0.15X-4.5 when X<100 and meet Y≤10 when X≥100.

2. The method for manufacturing a silicon substrate according to claim 1,
    wherein the rapid heat treatment is performed in an atmosphere containing a nitride-film forming atmospheric gas, a rare gas, or a mixture of these gases.

3. The method for manufacturing a silicon substrate according to claim 1,
    wherein the silicon substrate subjected to the rapid heat treatment is a silicon single crystal wafer sliced from a silicon single crystal ingot which is grown by the Czochralski method and has an entire plane of an OSF region, an N region, or a mixed region of the OSF region and the N region.

4. The method for manufacturing a silicon substrate according to claim 2, wherein the silicon substrate subjected to the rapid heat treatment is a silicon single crystal wafer sliced from a silicon single crystal ingot which is grown by the Czochralski method and has an entire plane of an OSF region, an N region, or a mixed region of the OSF region and the N region.

* * * * *